United States Patent
Kitamura

(10) Patent No.: US 10,902,973 B2
(45) Date of Patent: Jan. 26, 2021

(54) ANISOTROPIC CONDUCTIVE FILM AND PRODUCTION METHOD OF THE SAME

(71) Applicant: DEXERIALS CORPORATION, Tokyo (JP)

(72) Inventor: Kumiko Kitamura, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/115,838

(22) PCT Filed: Jan. 29, 2015

(86) PCT No.: PCT/JP2015/052492
§ 371 (c)(1),
(2) Date: Aug. 1, 2016

(87) PCT Pub. No.: WO2015/119033
PCT Pub. Date: Aug. 13, 2015

(65) Prior Publication Data
US 2017/0140850 A1    May 18, 2017

(30) Foreign Application Priority Data

Feb. 4, 2014 (JP) .................... 2014-019863

(51) Int. Cl.
*B32B 7/02* (2019.01)
*H01B 5/14* (2006.01)
(Continued)

(52) U.S. Cl.
CPC ............... *H01B 5/14* (2013.01); *B32B 27/08* (2013.01); *B32B 27/16* (2013.01); *B32B 27/20* (2013.01);
(Continued)

(58) Field of Classification Search
CPC .................... H05K 1/036; H01B 1/22
(Continued)

(56) References Cited

U.S. PATENT DOCUMENTS

2012/0028050 A1* 2/2012 Shiga .................... C08G 59/621
428/413
2013/0071636 A1* 3/2013 Lee ........................... C09J 9/02
428/206

FOREIGN PATENT DOCUMENTS

JP  H08-148211 A  6/1996
JP  2001-052778 A  2/2001
(Continued)

OTHER PUBLICATIONS

Machine Translation of JP 2001-052778 (Year: 2001).*
(Continued)

*Primary Examiner* — Prashant J Khatri
*Assistant Examiner* — Zachary M Davis
(74) *Attorney, Agent, or Firm* — Oliff PLC

(57) ABSTRACT

An anisotropic conductive film has a first insulating resin layer and a second insulating resin layer. The first insulating resin layer is formed of a photopolymerized resin, the second insulating resin layer is formed of a thermo-cationically or thermo-anionically polymerizable resin, a photo-cationically or photo-anionically polymerizable resin, a thermo-radically polymerizable resin, or a photo-radically polymerizable resin, and conductive particles for anisotropic conductive connection are disposed in a single layer on a surface of the first insulating resin layer on a side of the second insulating resin layer. The elastic modulus of the anisotropic conductive film as a whole is 0.13 MPa or more.

16 Claims, 6 Drawing Sheets

(51) Int. Cl.
  *B32B 27/08* (2006.01)
  *B32B 27/16* (2006.01)
  *B32B 27/20* (2006.01)
  *B32B 27/30* (2006.01)
  *B32B 27/38* (2006.01)
  *B32B 37/14* (2006.01)
  *B32B 37/16* (2006.01)
  *H01B 13/00* (2006.01)
  *H01R 4/04* (2006.01)
  *H01R 13/24* (2006.01)
  *H05K 3/32* (2006.01)
  *H01L 23/00* (2006.01)

(52) U.S. Cl.
  CPC ............ *B32B 27/308* (2013.01); *B32B 27/38* (2013.01); *B32B 37/144* (2013.01); *B32B 37/16* (2013.01); *H01B 13/0036* (2013.01); *B32B 2250/03* (2013.01); *B32B 2250/24* (2013.01); *B32B 2255/10* (2013.01); *B32B 2270/00* (2013.01); *B32B 2307/202* (2013.01); *B32B 2307/206* (2013.01); *B32B 2307/51* (2013.01); *B32B 2307/704* (2013.01); *B32B 2310/0831* (2013.01); *B32B 2333/00* (2013.01); *B32B 2363/00* (2013.01); *B32B 2457/00* (2013.01); *H01L 24/29* (2013.01); *H01R 4/04* (2013.01); *H01R 13/2414* (2013.01); *H05K 3/323* (2013.01)

(58) Field of Classification Search
  USPC ......................................... 427/487, 508, 510
  See application file for complete search history.

(56) References Cited

FOREIGN PATENT DOCUMENTS

| | | |
|---|---|---|
| JP | 2009-030060 A | 2/2009 |
| JP | 2010-033793 A | 2/2010 |
| JP | 4789738 B2 | 10/2011 |
| JP | 2013-014755 A | 1/2013 |
| JP | 2013-105636 A | 5/2013 |
| JP | 2013-149466 A | 8/2013 |
| WO | 2009/004902 A1 | 1/2009 |

OTHER PUBLICATIONS

Duncan et al., "Comparison of the uniaxial tensile modulus and dynamic shear storage modulus of a filled hydroxy-terminated polybutadiene and GAP propellant", 1996, Journal of Materials Science, vol. 31, pp. 1275-1284 (Year: 1996).*
Apr. 28, 2015 Search Report issued in International Patent Application No. PCT/JP2015/052492.
Apr. 28, 2015 Written Opinion issued in International Patent Application No. PCT/JP2015/052492.
Mar. 1, 2016 Written Opinion issued in International Patent Application No. PCT/JP2015/052492.
Sep. 9, 2016 International Preliminary Report on Patentability issued in International Patent Application No. PCT/JP2015/052492.
Aug. 23, 2017 Office Action issued in Japanese Application No. 2014-019863.
Feb. 27, 2018 Office Action issued in Chinese Application No. 201580007319.X.
Jun. 26, 2018 Office Action issued in Taiwanese Patent Application No. 104103537.

* cited by examiner

ANISOTROPIC CONDUCTIVE FILM AND PRODUCTION METHOD OF THE SAME

TECHNICAL FIELD

The present invention relates to an anisotropic conductive film and a production method of the same.

BACKGROUND ART

An anisotropic conductive film has been widely used in mounting of electronic components such as an IC chip. In recent years, an anisotropic conductive film having conductive particles for anisotropic conductive connection disposed in a single layer and an insulating resin layer having a two-layer structure has been proposed (Patent Literature 1), in order to improve the conduction reliability and the insulating properties, increase the conductive particle capture ratio, and decrease the production cost from the viewpoints of application to high-density mounting.

This anisotropic conductive film is produced by densely disposing conductive particles in a single layer on an adhesive layer, biaxially stretching the adhesive layer to form a sheet in which the conductive particles are arranged, transferring the conductive particles on the sheet onto an insulating resin layer containing a thermosetting resin and a latent curing agent, and further laminating another insulating resin layer containing a thermosetting resin and no latent curing agent on the transferred conductive particles (Patent Literature 1).

CITATION LIST

Patent Literature

Patent Literature 1: Japanese Patent No. 4789738

SUMMARY OF INVENTION

Technical Problem

However, the insulating resin layer containing no latent curing agent is used for the anisotropic conductive film in Patent Literature 1. Therefore, comparatively large resin flow tends to occur in the insulating resin layer containing no latent curing agent by heating during anisotropic conductive connection. Along the resin flow, the conductive particles also tend to flow. Although the conductive particles are arranged in a single layer at uniform intervals by biaxial stretching, there are problems such as a decrease in conductive particle capture ratio and occurrence of short circuit (decrease in insulating properties).

In addition, there are also problems in which the anisotropic conductive film has low stiffness and the film is ruptured or the resin remains on a connection surface under repair after temporary compression-bonding during anisotropic conductive connection.

An object of the present invention is to solve the problems in the conventional techniques described above, and to achieve favorable conductive particle capture ratio, favorable conduction reliability, and favorable repairability in an anisotropic conductive film having a multilayer structure having conductive particles disposed in a single layer.

Solution to Problem

The present inventor has found that an anisotropic conductive film obtained by disposing conductive particles in a single layer on a surface of a photopolymerizable resin layer, irradiating the photopolymerizable resin layer with ultraviolet light to fix the conductive particles in a photopolymerized resin, and further layering a polymerizable resin layer to be polymerized by heat or light on the fixed conductive particles has excellent conductive particle capture ratio and conduction reliability. The inventor has further found that when the stiffness of the anisotropic conductive film is enhanced by increasing the elastic modulus of the whole anisotropic conductive film, protrusion of molten insulating resin layer during anisotropic conductive connection can be suppressed, and repairability after temporary compression-bonding is improved. The present invention has thus been completed.

Specifically, the present invention provides an anisotropic conductive film having a first insulating resin layer and a second insulating resin layer that are layered, wherein the first insulating resin layer is formed of a photopolymerized resin, the second insulating resin layer is formed of a thermo-cationically or thermo-anionically polymerizable resin, a photo-cationically or photo-anionically polymerizable resin, a thermo-radically polymerizable resin, or a photo-radically polymerizable resin, conductive particles for anisotropic conductive connection are disposed in a single layer on a surface of the first insulating resin layer on a side of the second insulating resin layer, and the anisotropic conductive film as a whole has an elastic modulus of 0.13 MPa or more.

In particular, the present invention provides an aspect in which an intermediate layer formed of a crystalline resin is provided between the first and second insulating resin layers.

It is preferable that the second insulting resin layer be a thermopolymerizable resin layer using a thermopolymerization initiator that initiates a polymerization reaction by heating. The second insulating resin layer may be a photopolymerizable resin layer using a photopolymerization initiator that initiates a polymerization reaction by light. The second insulating resin layer may be a thermo- and photo-polymerizable resin layer using a thermopolymerization initiator and a photopolymerization initiator in combination.

The present invention provides a production method of the aforementioned anisotropic conductive film, including the following steps (A) to (C):

Step (A)

a step of disposing conductive particles in a single layer on a photopolymerizable resin layer;

Step (B)

a step of irradiating the photopolymerizable resin layer having the disposed conductive particles with ultraviolet light to cause a photopolymerization reaction, to thereby form the first insulating resin layer in which the conductive particles are fixed in a surface thereof; and Step (C)

a step of forming the second insulating resin layer that is formed of a thermo-cationically or thermo-anionically polymerizable resin, a photo-cationically or photo-anionically polymerizable resin, a thermo-radically polymerizable resin, or a photo-radically polymerizable resin, wherein the first insulating resin layer is formed by performing the photopolymerization reaction in the step (B) so that the elastic modulus of the anisotropic conductive film as a whole is 0.13 MPa or more, and the second insulating resin layer formed in the step (C) is layered on the first insulating resin layer formed in the step (B) on a side of the conductive particles.

As another production method of the anisotropic conductive film, the present invention provides a production method of the aforementioned anisotropic conductive film, including the following steps (A) to (D):

Step (A)

a step of disposing conductive particles in a single layer on a photopolymerizable resin layer;

Step (B)

a step of irradiating the photopolymerizable resin layer having the disposed conductive particles with ultraviolet light to cause a photopolymerization reaction, to thereby form the first insulating resin layer in which the conductive particles are fixed in a surface thereof;

Step (C)

a step of forming the second insulating resin layer that is formed of a thermo-cationically or thermo-anionically polymerizable resin, a photo-cationically or photo-anionically polymerizable resin, a thermo-radically polymerizable resin, or a photo-radically polymerizable resin; and Step (D)

a step of forming a layered body in which an intermediate layer formed of a crystalline resin and the second insulating resin layer are layered in sequence on the first insulating resin layer formed in the step (B) on a side of the conductive particles.

The present invention further provides a connection structure in which a first electronic component and a second electronic component are connected by anisotropic conductive connection through the aforementioned anisotropic conductive film.

Advantageous Effects of Invention

In the anisotropic conductive film of the present invention, the first insulating resin layer that is obtained by photopolymerizing a photopolymerizable resin layer and the second insulating resin layer to be polymerized by heat or light are layered, and the conductive particles for anisotropic conductive connection are disposed in a single layer on a surface of the first insulating resin layer on a side of the second insulating resin layer. For this reason, the conductive particles can be firmly fixed by the first insulating resin layer that is photopolymerized. Thus, the flow of the conductive particles in a terminal surface direction due to resin flow during anisotropic conductive connection can be prevented. Therefore, according to the anisotropic conductive film of the present invention, favorable conductive particle capture ratio and conduction reliability, and low short circuit occurrence ratio can be achieved.

In particular, when a photopolymerizable resin is irradiated with ultraviolet light from the side of the conductive particles to photopolymerize the photopolymerizable resin in the formation of the first insulating resin layer, the photopolymerizable resin under (on the back side of) the conductive particles is not sufficiently irradiated with ultraviolet light due to a shadow of the conductive particles. Therefore, the photopolymerized resin that is shadowed by the conductive particles has a curing ratio relatively lower than that of the photopolymerized resin that is not shadowed, and the conductive particles are favorably pushed during anisotropic conductive connection. Accordingly, better conduction reliability and a further decrease in short circuit occurrence ratio can be achieved.

On the other hand, in the formation of the first insulating resin layer, when the photopolymerizable resin is irradiated with ultraviolet light from a side opposite to the conductive particles or sides of both surfaces, the fixation of the conductive particles is promoted. Stable quality can thus be secured at a production line of the anisotropic conductive film. Even when an unnecessary external stress is applied to the anisotropic conductive film at processes of winding the produced anisotropic conductive film around a reel and unrolling the film from the reel during anisotropic conductive connection, the external stress hardly affects the arrangement of the conductive particles before anisotropic conductive connection.

In general, in the anisotropic conductive film wound around the reel, the insulating resin layer may be protruded by the stress applied to the anisotropic conductive film. Further, the anisotropic conductive film may not be repaired after temporary compression-bonding due to low stiffness (low rigidity). However, in the anisotropic conductive film of the present invention, the elastic modulus of the anisotropic conductive film as a whole is 0.13 MPa or more, and the anisotropic conductive film is stiff. Therefore, the protrusion of the insulating resin layer can be suppressed, and repairability after temporary compression-bonding can be improved. Because of stiffness of the film, disordered arrangement of the conductive particles due to shift or bending of the film can be prevented even in fixation to a substrate during temporary compression-bonding.

When the second insulating resin layer in the anisotropic conductive film of the present invention is formed of a polymerizable resin to be reacted by heat, anisotropic conductive connection of electronic components using the anisotropic conductive film can be performed in the same manner as a connection method using a general anisotropic conductive film.

On the other hand, when the second insulating resin layer in the anisotropic conductive film of the present invention is formed of a polymerizable resin to be reacted by light, anisotropic conductive connection of first and second electronic components using the anisotropic conductive film may be performed by pushing by a connection tool before a photoreaction is completed. Even in this case, the connection tool or the like may be heated to promote resin flow and particle pushing. Even when the polymerizable resin to be reacted by heat and the polymerizable resin to be reacted by light are used in the second insulating resin layer in combination, pushing by the connection tool may be performed before a photoreaction is completed in the same manner as described above, and heating may be performed simultaneously.

When the first and second electronic components are anisotropically conductively connected using a photoreaction, the film may be irradiated with light from a side of the electronic component that has light transparency.

DESCRIPTION OF EMBODIMENTS

Figure 1:
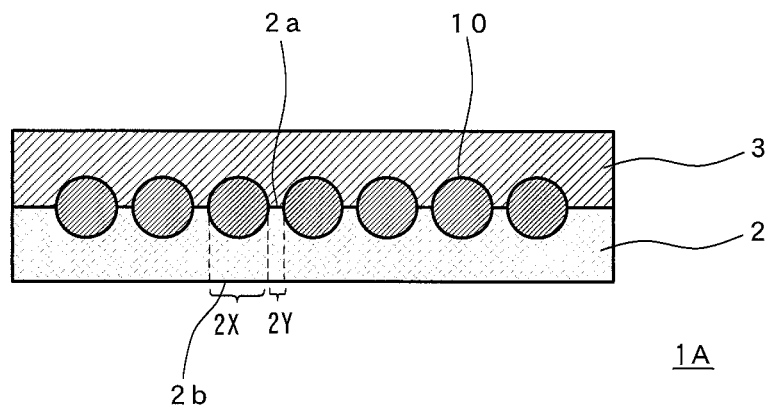
FIG. 1 is a cross-sectional view of an anisotropic conductive film 1A of a first embodiment of the present invention.

Hereinafter, an example of the anisotropic conductive film of the present invention will be described in detail with reference to the drawings. In each drawing, the same reference numerals denote the same or similar elements. In the present invention, the elastic modulus of the anisotropic conductive film is determined by applying a constant displacement (measurement pressure: 0 to 5 g) at 30° C. in a twisting direction by a rotational rheometer (TA Instruments) and measuring a change of stress over time, and measuring a stress (elastic modulus) of an adhesive material at an elapse time of 0.1 minutes, followed by calculation.

<<Anisotropic Conductive Film>>

FIG. 1 is a cross-sectional view of an anisotropic conductive film 1A of a first embodiment of the present invention. In this anisotropic conductive film 1A, a first insulating resin layer 2 and a second insulating resin layer 3 are layered, and conductive particles 10 for anisotropic conductive connection are disposed in a single layer on a surface 2a of the first insulating resin layer 2 on a side of the second insulating resin layer 3.

Figure 2:
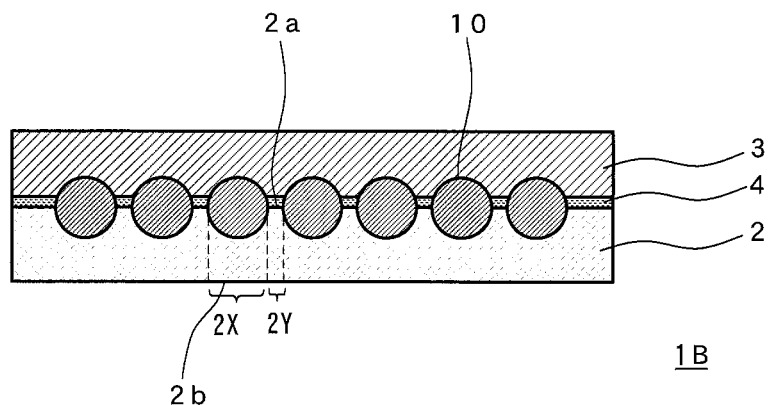
FIG. 2 is a cross-sectional view of an anisotropic conductive film 1B of a second embodiment of the present invention.

FIG. 2 is a cross-sectional view of an anisotropic conductive film 1B of a second embodiment of the present invention. This anisotropic conductive film 1B is different from the anisotropic conductive film 1A of the first embodiment in that an intermediate layer 4 formed of a crystalline resin is provided between the first insulating resin layer 2 and the second insulating resin layer 3.

Even in any of the anisotropic conductive films 1A and 1B, the elastic modulus of the anisotropic conductive film as a whole is 0.13 MPa or more, and for this reason, the anisotropic conductive films are stiff. However, the anisotropic conductive films 1A and 1B are different from each other in that in the anisotropic conductive film 1A of the first embodiment in FIG. 1, the elastic modulus of the first insulating resin layer 2 largely contributes to the stiffness of the film, and in the anisotropic conductive film 1B of the second embodiment in FIG. 2, the elastic modulus of the intermediate layer 4 largely contributes to the stiffness of the film. Otherwise, the first anisotropic conductive film 1A and the second anisotropic conductive film 1B are configured similarly.

<First Insulating Resin Layer 2>

The first insulating resin layer 2 constituting the anisotropic conductive films 1A and 1B of the present invention is formed of a photopolymerized resin. For example, the first insulating resin layer 2 is formed by photo-radically polymerizing a photo-radically polymerizable resin layer containing an acrylate compound and a photo-radical polymerization initiator. Since the first insulating resin layer 2 is photopolymerized, the conductive particles 10 can be appropriately fixed. Therefore, even when the anisotropic conductive film 1A is heated during anisotropic conductive connection, the first insulating resin layer 2 is unlikely to flow. Accordingly, the occurrence of short circuit due to unnecessarily flowed conductive particles 10 caused by resin flow can be largely suppressed.

Here, in the anisotropic conductive film 1A of the first embodiment, a photopolymerization reaction is performed so that the elastic modulus of the first insulating resin layer 2 is 0.06 MPa or more. Thus, stiffness is imparted to the anisotropic conductive film so that the elastic modulus of the anisotropic conductive film 1A as a whole is 0.13 MPa or more.

The elastic modulus of such a first insulating resin layer 2 can be adjusted by adjusting the curing ratio by the irradiation dose of ultraviolet light to a photopolymerizable resin layer forming the first insulating resin layer 2, mixing of an elastic body, or the like.

In the anisotropic conductive films 1A and 1B of the first and second embodiments, it is preferable that the curing ratio in a region 2X of the first insulating resin layer 2 where the conductive particles 10 are present on the side of the second insulating resin layer 3 (i.e., a region between the conductive particles 10 and an outer surface 2b of the first insulating resin layer 2) be lower than that in a region 2Y of the first insulating resin layer 2 where the conductive particles 10 are not present on the side of the second insulating resin layer 3. In the region 2X of the first insulating resin layer 2, the acrylate compound and the photo-radical polymerization initiator in which light curing does not proceed may remain. When the anisotropic conductive films 1A and 1B have such a region 2X, an insulating resin in the region 2X is easy to be removed during anisotropic conductive connection. Therefore, the conductive particles 10 are unlikely to move in a plane direction of the first insulating resin layer 2, but are favorably pushed in a thickness direction. Accordingly, the conductive particle capture ratio can be improved, and the conduction reliability and the insulating properties can also be improved.

The curing ratio herein represents a value defined as a decrease ratio of a vinyl group. The curing ratio in the region 2X of the first insulating resin layer is preferably 40 to 80%, and the curing ratio in the region 2Y is preferably 70 to 100% in terms of pushing properties of the conductive particles 10 in the thickness direction. In the anisotropic conductive film 1A of the first embodiment, it is further preferable that the curing ratio of the first insulating resin layer 2 as a whole be 75 to 100% in order to allow the elastic modulus of the first insulating resin layer 2 to be 0.06 MPa or more.

(Acrylate Compound)

As an acrylate compound that is an acrylate unit, a conventionally known photopolymerizable acrylate can be used. For example, a monofunctional (meth)acrylate (herein, (meth)acrylate includes acrylate and methacrylate), or a multifunctional (meth)acrylate having two or more functional groups can be used. In the present invention, in order to thermally cure the insulating resin layer during anisotropic conductive connection, it is preferable that a multifunctional (meth)acrylate be used for at least a portion of an acrylic monomer.

When the content of the acrylate compound in the first insulating resin layer 2 is too small, a difference between the viscosity of the first insulating resin layer 2 and that of the second insulating resin layer 3 during anisotropic conductive connection tends not to be produced. When the content thereof is too large, the curing shrinkage tends to increase and the workability tends to decrease. Therefore, the content is preferably 2 to 70% by mass, and more preferably 10 to 50% by mass.

(Polymerization Initiator)

As the photopolymerization initiator used in the formation of the first insulating resin layer, a publicly known photopolymerization initiator can be appropriately selected and used. Examples of the publicly known photopolymerization initiator may include photo-radical polymerization initiators, such as an acetophenone-based photopolymerization initiator, a benzylketal-based photopolymerization initiator, and a phosphorus-based photopolymerization initiator.

In addition to the photopolymerization initiator, a thermopolymerization initiator may be used. Examples of the thermopolymerization initiator may include thermal radical polymerization initiators, such as an organic peroxide and an azo-based compound. An organic peroxide that does not generate nitrogen causing bubbles can be preferably used.

When the amount of the photopolymerization initiator to be used is too small relative to 100 parts by mass of the acrylate compound, photopolymerization does not sufficiently proceed. When the amount is too large, stiffness may decrease. Therefore, the amount is preferably 0.1 to 25 parts by mass, and more preferably 0.5 to 15 parts by mass.

(Other Resin and Polymerization Initiator)

If necessary, the first insulating resin layer 2 may further contain an epoxy compound, and a thermal cationic or thermal anionic polymerization initiator, or a photo-cationic or photo-anionic polymerization initiator. Thus, the delamination strength can be improved. The polymerization initiator used with the epoxy compound will be described in the second insulating resin layer 3. In the first insulating resin layer 2, if necessary, a film-forming resin such as a phenoxy resin, an unsaturated polyester resin, a saturated polyester resin, a urethane resin, a butadiene resin, a polyimide resin, a polyamide resin, or a polyolefin resin can also be used in combination.

When the thickness of the first insulating resin layer 2 is too small, the conductive particle capture ratio tends to decrease. When the thickness is too large, the conduction resistance tends to increase. Therefore, the thickness is preferably 1.0 to 6.0 µm, and more preferably 2.0 to 5.0 µm.

The first insulating resin layer 2 can be formed, for example, by attaching the conductive particles in a single layer to a photopolymerizable resin layer containing a photopolymerizable resin and a photopolymerization initiator by a procedure such as a film transfer method, a mold transfer method, an inkjet method, and an electrostatic attachment method, and irradiating the photopolymerizable resin layer with ultraviolet light. In this case, it is preferable that the photopolymerizable resin layer be irradiated with ultraviolet light from the side of the conductive particles, but the photopolymerizable resin layer may be irradiated from a side opposite to the conductive particles. In particular, it is preferable that the photopolymerizable resin layer be irradiated with ultraviolet light only from the side of the conductive particles since the curing ratio in the region 2X of the first insulating resin layer can be made relatively lower than that in the region 2Y.

Photopolymerization may be performed in a single step (that is, irradiation with light once), or in two steps (that is, irradiation with light two times). In this case, it is preferable that, after formation of the second insulating resin layer 3 on a surface of the first insulating resin layer 2, the first insulating resin layer 2 be irradiated with light in the second step from a side of another surface of the first insulating resin layer 2 under an oxygen-containing atmosphere (in the air) while the irradiation intensity be adjusted so that the curing ratio in the region 2X is lower than that in the region 2Y, or a mask be used.

When such photopolymerization in two steps is performed, the curing ratio in the region 2X of the first insulating resin layer in the first step is preferably 10 to 50%, the curing ratio in the region 2X in the second step is preferably 40 to 80%, the curing ratio in the region 2Y in the first step is preferably 30 to 90%, and the curing ratio in the region 2Y in the second step is preferably 75 to 100% in terms of pushing properties in the thickness direction of the conductive particles 10.

When photopolymerization is performed in two steps, only one kind of the polymerization initiator may be used. It is preferable, however, that two kinds of photopolymerization initiators having different wavelength ranges that initiate a reaction be used in order to improve the tackiness. For example, it is preferable that IRGACURE 369 (BASF Japan Ltd.) that initiates a radical reaction by light having a wavelength of 365 nm from an LED light source and IRGACURE 2959 (BASF Japan Ltd.) that initiates a radical reaction by light from a light source of a high pressure mercury lamp be used in combination. When two kinds of different photopolymerization initiators are thus used, bonding of the resin is complicated. As a result, behavior of thermal flow of the resin during anisotropic conductive connection can be finely controlled.

It is preferable that the lowest melt viscosity of the first insulating resin layer 2 after photopolymerization be higher than that of the second insulating resin layer 3. Specifically, a value of [the lowest melt viscosity of the first insulating resin layer 2 (mPa·s)]/[the lowest melt viscosity of the second insulating resin layer 3 (mPa·s)] that are measured by a rheometer is preferably 1 to 1,000, and more preferably 4 to 400. The lowest melt viscosity of the first insulating resin layer 2 is preferably 100 to 100,000 mPa·s, and more preferably 500 to 50,000 mPa·s. The lowest melt viscosity of the second insulating resin layer 3 is preferably 0.1 to 10,000 mPa·s, and more preferably 0.5 to 1,000 mPa·s.

<Conductive Particles>

As the conductive particles 10, conductive particles used in conventionally known anisotropic conductive films can be appropriately selected and used. Examples of the conductive particles may include metal particles such as nickel, cobalt, silver, copper, gold, and palladium particles, and metal-coated resin particles. Two or more kinds thereof may be used in combination.

When the average particle diameter of the conductive particles is too small, the variation of heights of wirings cannot be absorbed, and the resistance tends to increase. When the average particle diameter is too large, short circuit tends to occur. Therefore, the average particle diameter is preferably 1 μm to 10 μm, and more preferably 2 μm to 6 μm.

When the amount of such conductive particles in the first insulating resin layer 2 is too small, the capture number of particles decreases, and the anisotropic conductive connection is difficult. When the amount is too large, short circuit may occur. Therefore, the amount is preferably 50 to 50,000, and more preferably 200 to 30,000 per square millimeter.

It is preferable that the positions of the conductive particles 10 in the thickness direction of the first insulating resin layer 2 be not a position in which the conductive particles 10 are embedded in the first insulating resin layer 2 but a position in which the conductive particles 10 eat to the second insulating resin layer 3, as shown in FIGS. 1 and 2. When the conductive particles 10 are embedded in the first insulating resin layer 2, the conduction resistance of a connection structure anisotropically conductively connected to electronic components may increase. In terms of balance of the conductive particle capture ratio and the conduction resistance, a degree of eating-into (specifically, a degree at which the conductive particles are protruded from the first insulating resin layer 2) is preferably 10 to 90%, and more preferably 20 to 80% of the average particle diameter of the conductive particles 10.

<Second Insulating Resin Layer 3>

The second insulating resin layer 3 is formed of a thermo-cationically or thermo-anionically polymerizable resin, a photo-cationically or photo-anionically polymerizable resin, a thermo-radically polymerizable resin, or a photo-radically polymerizable resin. Specifically, the second insulating resin layer 3 includes a polymerizable resin layer that contains an epoxy compound and a thermal cationic or thermal anionic polymerization initiator or a photo-cationic or photo-anionic polymerization initiator and is to be polymerized by heat or light or a polymerizable resin layer that contains an acrylate compound and a thermal radical or photo-radical polymerization initiator and is to be radically polymerized by heat or light.

(Epoxy Compound)

As the epoxy compound forming the second insulating resin layer 3, a compound or a resin having two or more epoxy groups in the molecule may preferably be mentioned. The compound and the resin may be liquid or solid.

(Thermal Cationic Polymerization Initiator)

As the thermal cationic polymerization initiator forming the second insulating resin layer 3, a publicly known thermal cationic polymerization initiator for an epoxy compound can be used. For example, a iodonium salt, sulfonium salt, phosphonium salt, or ferrocenes that generates an acid by heat can be used. An aromatic sulfonium salt that exhibits favorable latency for temperature can be particularly preferably used.

When the amount of the thermal cationic polymerization initiator to be added is too small, curing tends to be difficult. When the amount is too large, the product life tends to be reduced. Therefore, the amount is preferably 2 to 60 parts by mass, and more preferably 5 to 40 parts by mass, relative to 100 parts by mass of the epoxy compound.

(Thermal Anionic Polymerization Initiator)

As the thermal anionic polymerization initiator forming the second insulating resin layer 3, a publicly known thermal anionic polymerization initiator for an epoxy compound can be used. For example, an aliphatic amine-based compound, aromatic amine-based compound, secondary or tertiary amine-based compound, imidazole-based compound, polymercaptan-based compound, boron trifluoride-amine complex, dicyandiamide, or organic acid hydrazide that generates a base by heat can be used. An encapsulated imidazole-based compound that exhibits favorable latency for temperature can be particularly preferably used.

When the amount of the thermal anionic polymerization initiator to be added is too small, curing tends to be difficult. When the amount is too large, the product life tends to be reduced. Therefore, the amount is preferably 2 to 60 parts by mass, and more preferably 5 to 40 parts by mass, relative to 100 parts by mass of the epoxy compound.

(Photo-Cationic Polymerization Initiator and Photo-Anionic Polymerization Initiator)

As the photo-cationic polymerization initiator or the photo-anionic polymerization initiator for an epoxy compound, a publicly known polymerization initiator can be appropriately used.

(Acrylate Compound)

As the acrylate compound forming the second insulating resin layer 3, the acrylate compound described in relation to the first insulating resin layer 2 can be appropriately selected and used.

(Thermal Radical Polymerization Initiator)

As the thermal radical polymerization initiator used with an acrylate compound when the second insulating resin layer 3 contains the acrylate compound, the thermal radical polymerization initiator described in relation to the first insulating resin layer 2 can be appropriately selected and used.

When the amount of the thermal radical polymerization initiator to be used is too small, curing is difficult. When the amount is too large, the product life is reduced. Therefore, the amount is preferably 2 to 60 parts by mass, and more preferably 5 to 40 parts by mass, relative to 100 parts by mass of the acrylate compound.

(Photo-Radical Polymerization Initiator)

As the photo-radical polymerization initiator for an acrylate compound, a publicly known photo-radical polymerization initiator can be used.

When the amount of the photo-radical polymerization initiator to be used is too small, curing is difficult. When the amount is too large, the product life is reduced. Therefore, the amount is preferably 2 to 60 parts by mass, and more preferably 5 to 40 parts by mass, relative to 100 parts by mass of the acrylate compound.

(Thicknesses of Second Insulating Resin Layer 3)

The thickness of the second insulating resin layer 3 is preferably 3 to 20 μm, and more preferably 5 to 15 μm in terms of conductive particle capture properties during anisotropic conductive connection.

<Intermediate Layer 4>

In the anisotropic conductive film 1B of the second embodiment as shown in FIG. 2, the intermediate layer 4 is a layer provided between the first and second insulating resin layers, and is formed of a crystalline resin.

It is preferable that the crystalline resin forming the intermediate layer 4 be hard at normal temperature. It is preferable that the elastic modulus of a layered film of the intermediate layer 4 and the first insulating resin layer 2 become 0.14 MPa or more. Thus, the elastic modulus of the anisotropic conductive film 1B as a whole can be 0.13 MPa or more. Therefore, the protrusion of the insulating resin layer can be suppressed, and the repairability after temporary compression-bonding can be improved.

It is preferable that the crystalline resin forming the intermediate layer 4 be not molten by heat during temporary compression-bonding of anisotropic conductive connection, but be molten by applying heat of final compression-bonding. By melting in the final compression-bonding, the conduction reliability in anisotropic conductive connection can be maintained. It is further preferable that the resin forming the intermediate layer 4 have solvent resistance and heat resistance in terms of ease of production of the anisotropic conductive film.

Examples of the crystalline resin forming the intermediate layer 4 may include polyester such as PET, polyolefin such as polypropylene and polyethylene, nylon, and ionomer.

It is preferable that the thickness of the intermediate layer 4 fall within a range of 5 to 40% of the whole thickness in terms of various handleabilities from production of the anisotropic conductive film to an anisotropic conductive connection process.

<<Production Method of Anisotropic Conductive Film>>

The anisotropic conductive film 1A of the first embodiment of the present invention can be produced by performing the following steps (A) to (C).

(Step (A))

Figure 3A:
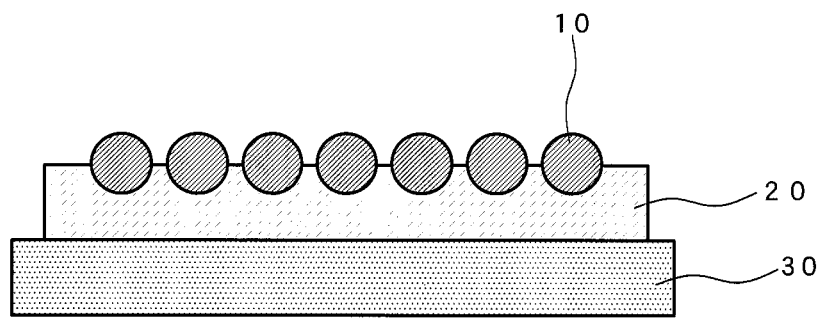
FIG. 3A is an explanatory diagram of a step (A) in a production method of the anisotropic conductive film of the first embodiment.

As shown in FIG. 3A, the conductive particles 10 are disposed in a single layer on a photopolymerizable resin layer 20 that is formed on a release film 30, if necessary. A procedure of disposing the conductive particles 10 in a single layer in the photopolymerizable resin layer 20 is not particularly limited. A method using a biaxial stretching operation for a resin film to which conductive particles are fixed with an adhesive as described in Example 1 of Japanese Patent No. 4789738, a method using a mold in Japanese Patent Application Laid-Open No. 2010-33793, or other methods may be used. It is preferable that the disposition of the conductive particles 10 be such that the conductive particles 10 are arranged at predetermined intervals lengthwise and crosswise. In consideration of the size, conduction reliability, insulating properties, and conductive particle capture ratio of a connection subject, the conductive particles are preferably arranged so as to be two-dimensionally apart about 1 to about 100 μm from each other.

(Step (B))

Figure 3B:
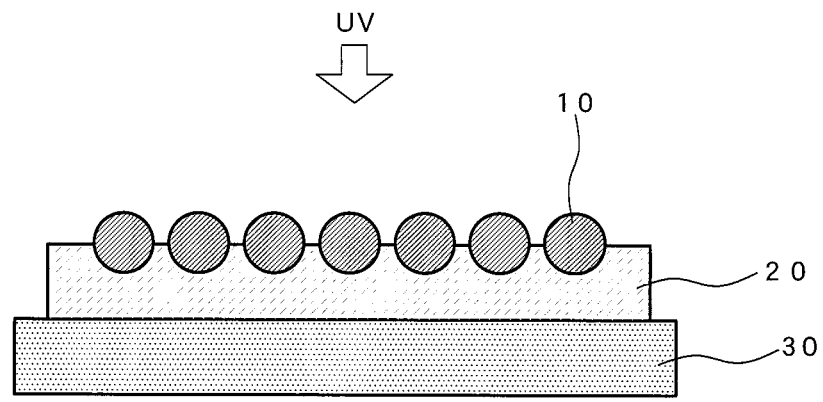
FIG. 3B is an explanatory diagram of a step (B) in the production method of the anisotropic conductive film of the first embodiment.
Figure 3C:
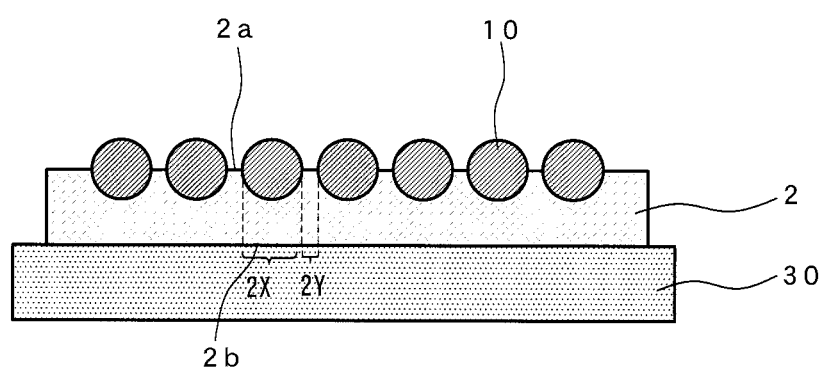
FIG. 3C is an explanatory diagram of the step (B) in the production method of the anisotropic conductive film of the first embodiment.

Next, the photopolymerizable resin layer 20 having the disposed conductive particles 10 is irradiated with ultraviolet light (UV) to cause a photopolymerization reaction, whereby the first insulating resin layer 2 in which the conductive particles 10 are fixed in a surface thereof is formed. In this case, as shown in FIG. 3B, it is preferable that the photopolymerizable resin layer 20 is irradiated with ultraviolet light (UV) from the side of the conductive particles 10. As shown in FIG. 3C, the curing ratio of the first insulating resin layer in the region 2X where the conductive particles 10 are present on a side of the second insulating resin layer 3 in the first insulating resin layer 2 (a region between a surface 2b of the first insulating resin layer 2 on a side of the release film 30 and the conductive particles 10) can be made lower than that in the region 2Y where the conductive particles 10 are not present on a side of the second insulating resin layer 3. Therefore, pushing of the conductive particles 10 during anisotropic conductive connection can be facilitated and the flow of the conductive particles 10 in a connection plane direction can be suppressed.

In this photopolymerization reaction, the curing ratio of the first insulating resin layer 2 is adjusted so that the elastic modulus of the whole anisotropic conductive film 1A is 0.13 MPa or more.

(Step (C))

Figure 3D:
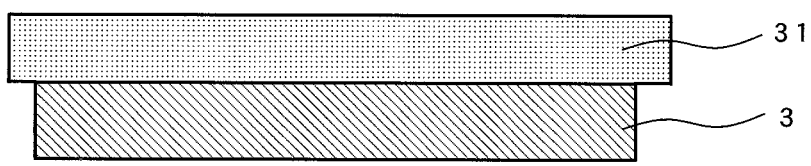
FIG. 3D is an explanatory diagram of a step (C) in the production method of the anisotropic conductive film of the first embodiment.

As shown in FIG. 3D, on the other hand, the second insulating resin layer 3 that is formed of a thermo-cationically or thermo-anionically polymerizable resin, a photo-cationically or photo-anionically polymerizable resin, a thermo-radically polymerizable resin, or a photo-radically polymerizable resin is formed on a release film 31.

Figure 3E:
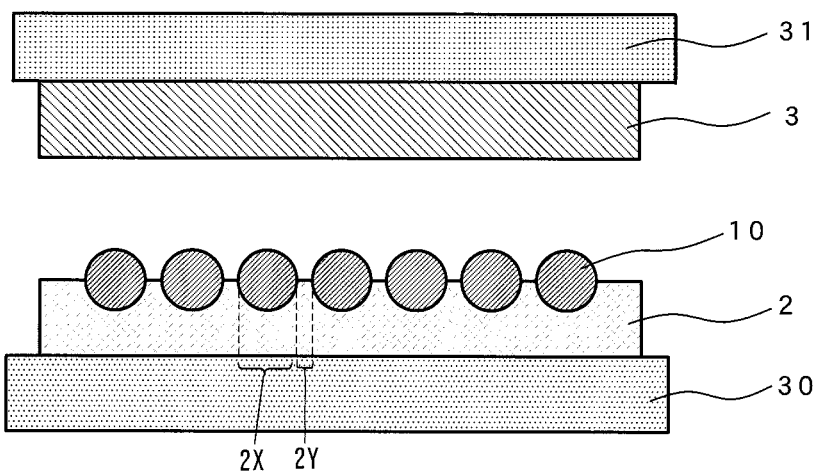
FIG. 3E is an explanatory diagram of a step subsequent to the step (C) in the production method of the anisotropic conductive film of the first embodiment.
Figure 3F:
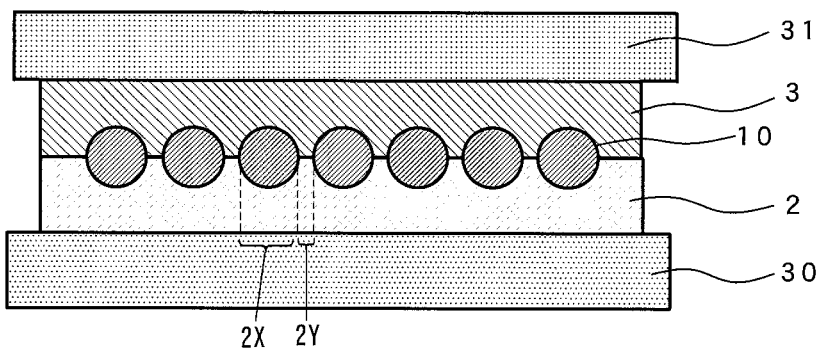
FIG. 3F is an explanatory diagram of a step subsequent to the step (C) in the production method of the anisotropic conductive film of the first embodiment.

After that, the second insulating resin layer 3 formed in the step (C) and the conductive particles 10 on the first insulating resin layer 2 formed in the step (B) are faced to each other, as shown in FIG. 3E, and thermocompression-bonded, as shown in FIG. 3F. In this case, occurrence of excessive thermopolymerization due to thermocompression-bonding is prevented. The release films 30 and 31 are removed. Thus, the anisotropic conductive film 1A of FIG. 1 can be obtained.

On the other hand, in the production method of the anisotropic conductive film 1B of the second embodiment of the present invention, the steps (A), (B), and (C) are first performed in the same manner as in the production method of the anisotropic conductive film 1A of the first embodiment.

Figure 4A:
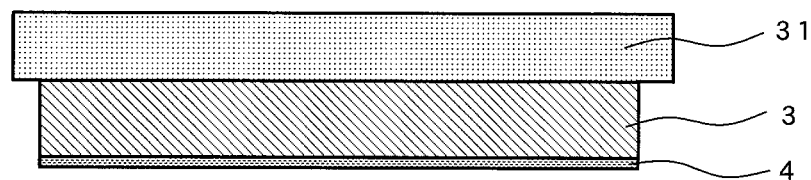
FIG. 4A is an explanatory diagram of a process (i) of a step (D) in the production method of the anisotropic conductive film of the second embodiment.
Figure 4B:
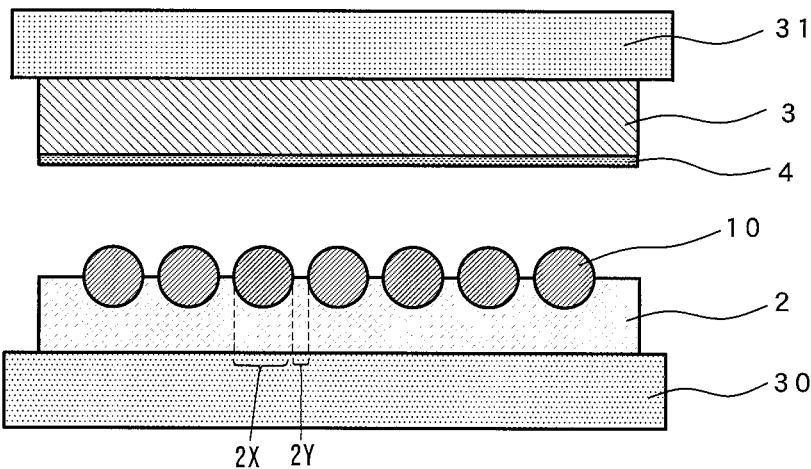
FIG. 4B is an explanatory diagram of the process (i) of the step (D) in the production method of the anisotropic conductive film of the second embodiment.
Figure 4C:
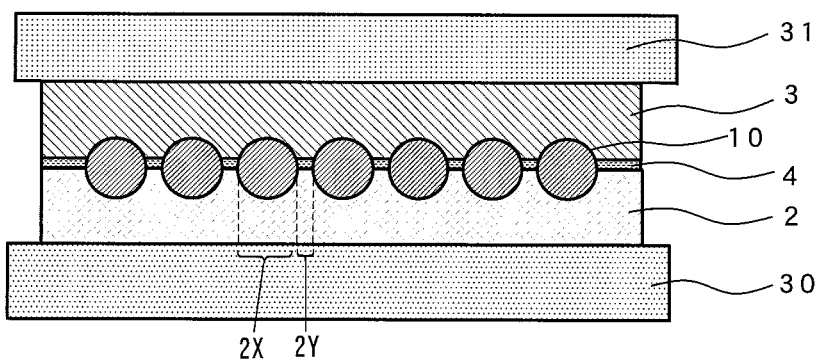
FIG. 4C is a cross-sectional view of the anisotropic conductive film obtained by the process (i) of the step (D) in the production method of the anisotropic conductive film of the second embodiment.
Figure 6:
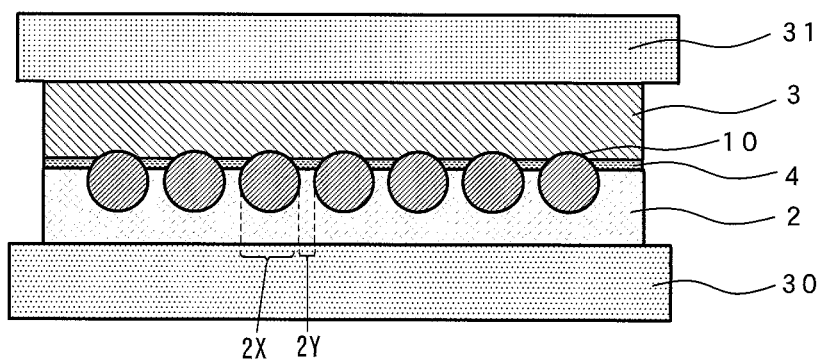
FIG. 6 is a cross-sectional view of the anisotropic conductive film obtained by the process (ii) of the step (D) in the production method of the anisotropic conductive film of the second embodiment.

Subsequently, a layered body in which the intermediate layer formed of the crystalline resin and the second insulating resin layer are layered in sequence on the first insulating resin layer formed in the step (B) on the side of the conductive particles is formed in the step (D), as shown in FIG. 4C or 6. This step (D) may be performed by the following process (i) or (ii).

Process (i)

The intermediate layer 4 formed of the crystalline resin is layered on a surface of the second insulating resin layer 3 formed in the step (C), as shown in FIG. 4A. The intermediate layer 4 of the layered body and a surface of the first insulating resin layer 2 on the side of the conductive particles 10 where the conductive particles 10 are fixed in the step (B) are then faced to each other, as shown in FIG. 4B, and thermocompression-bonded, as shown in FIG. 4C. The release films 30 and 31 are removed. Thus, the anisotropic conductive film 1B of FIG. 2 can be obtained.

Process (ii)

Figure 5:
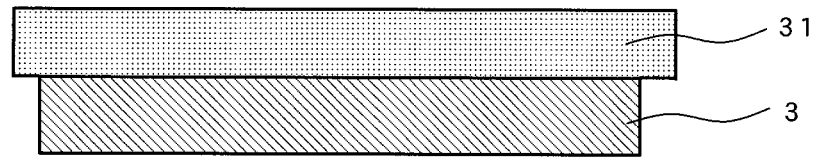
FIG. 5 is an explanatory diagram of a process (ii) of the step (D) in the production method of the anisotropic conductive film of the second embodiment.
Figure 5:
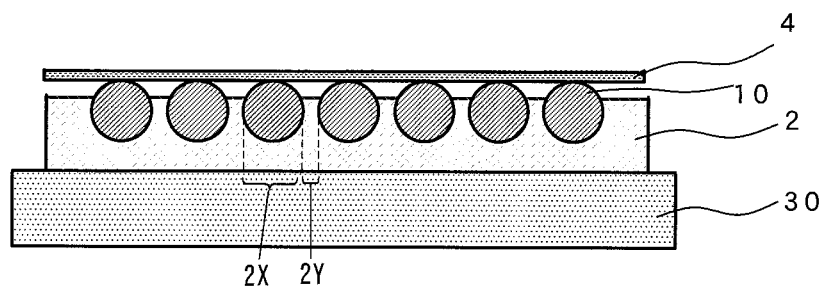

The intermediate layer 4 formed of the crystalline resin is layered on the surface of the first insulating resin layer 2 on the side of the conductive particles 10 where the conductive particles 10 are fixed in the step (B), as shown in FIG. 5. The second insulating resin layer 3 formed in the step (C) is faced onto the layered body, and thermocompression-bonded and layered, as shown in FIG. 6. The release films 30 and 31 are removed. Thus, the anisotropic conductive film 1B of FIG. 2 can be obtained.

The amount of the conductive particles 10 protruded from the first insulating resin layer 2 in FIGS. 5 and 6 is less than that in the anisotropic conductive film 1B shown in FIG. 2. This shows that the amount of the conductive particles 10 protruded from the first insulating resin layer 2 is variously varied in the present invention.

<<Connection Structure>>

The anisotropic conductive films 1A and 1B of the present invention can be preferably applied to anisotropic conductive connection between a first electronic component such as an IC chip and an IC module and a second electronic component such as a flexible substrate and a glass substrate. The resultant connection structure is also a part of the present invention. It is preferable that a surface of the anisotropic conductive film on the side of the first insulating resin layer 2 be disposed on a side of the second electronic component such as a flexible substrate and a surface of the anisotropic conductive film on the side of the second insulating resin layer 3 be disposed on a side of the first electronic component such as an IC chip since the conduction reliability is enhanced.

EXAMPLES

Hereinafter, the present invention will be described specifically by Examples.

Examples 1 to 6 and Comparative Example 1

Conductive particles were arranged in a single layer in accordance with an operation of Example 1 of Japanese Patent No. 4789738. Anisotropic conductive films in which a first insulating resin layer, an intermediate layer, and a second insulating resin layer that were formed in accordance with a composition (parts by mass) shown in Table 1 were layered were produced while the elastic modulus of the first insulating resin layer or the elastic modulus of the intermediate layer was varied.

Specifically, an acrylate compound, a photo-radical polymerization initiator, and the like were mixed in ethyl acetate or toluene to prepare a mixed liquid having a solid content of 50% by mass. This mixed liquid was applied to a polyethylene terephthalate film having a thickness of 50 μm so as to have a dried thickness of 3 μm, and dried in an oven at 80° C. for 5 minutes, to form a photo-radically polymerizable resin layer that was a precursor layer of the first insulating resin layer.

Subsequently, conductive particles (Ni/Au-plated resin particles, AUL 704, SEKISUI CHEMICAL CO., LTD.) having an average particle diameter of 4 μm were arranged on a surface of the obtained photo-radically polymerizable resin layer in a single layer in a latticed pattern so that the closest distance between the conductive particles was 4 μm. The photo-radically polymerizable resin layer was irradiated with ultraviolet light having a wavelength of 365 nm at an integrated light amount of 4,000 mJ/cm$^2$ from the side of the conductive particles. Thus, the first insulating resin layer in which the conductive particles were fixed in a surface thereof was formed. In this case, the elastic modulus of the first insulating resin layer was varied, as shown in Table 1, by varying the irradiation dose of ultraviolet light.

Further, a thermosetting resin, a polymerization initiator, and the like were mixed in ethyl acetate or toluene to prepare a mixed liquid having a solid content of 50% by mass in order to form the second insulating resin layer. This mixed liquid was applied to a polyethylene terephthalate film having a thickness of 50 μm so as to have a dried thickness of 12 μm, and dried in an oven at 80° C. for 5 minutes, to form the second insulating resin layer.

On the other hand, for the intermediate layer, three kinds of crystalline resins having different melting points (NOVATEC EVA LV211A (mp. 100° C.) and NOVATEC HD HF560 (mp. 130° C.) available from Japan Polyethylene Corporation, and Prime Polypro F329RA (mp. 160° C.) available from Prime Polymer Co., Ltd.) were stretched into a film having a thickness of 5 μm and prepared.

The first insulating resin layer in which the conductive particles were fixed, the crystalline polyester film as the intermediate layer, and the second insulating resin layer obtained as described above were laminated so that the conductive particles were located inside, to obtain anisotropic conductive films of Examples 1 to 6 and Comparative Example 1. In this case, the intermediate layer was not provided in Example 1 and Comparative Example 1.

Example 7

An anisotropic conductive film was obtained in the same manner as in Example 2 except that a photo-radically polymerizable resin layer was irradiated with ultraviolet light at an integrated light amount of 2,000 mJ/cm$^2$ from a side of the conductive particles and a side opposite to the conductive particles.

Evaluation

For the anisotropic conductive films of each of Examples and Comparative Example, (a) the elastic modulus of the anisotropic conductive film as a whole, (b) the elastic modulus of the first insulating resin layer, (c) the elastic modulus of the layered body of the first insulating resin layer and the intermediate layer, (d) temporary compression-bonding repairability of the anisotropic conductive film, (e) the mounting conductive particle capture ratio of a connection structure sample anisotropically conductively connected using the anisotropic conductive film, and (f) the initial conduction of the connection structure sample were evaluated or measured as follows. The results are shown in Table 1.

(a) (b) (c) Elastic Modulus

A fixed displacement (measurement pressure: 0 to 5 g) at 30° C. in a twisting direction was applied by a rotational rheometer (TA Instruments), and a change of stress over time was measured, and a stress (elastic modulus) of the film at an elapse time of 0.1 minutes was determined.

(d) Temporary Compression-Bonding Repairability

Each anisotropic conductive film was temporarily compression-bonded to a glass for evaluation of compression-bonding properties of the film (the entire surface was coated with ITO, glass thickness: 0.7 mm). In this case, the first insulating resin layer of the anisotropic conductive film slit to have a width of 1.5 mm was temporarily compression-bonded to the glass for evaluation by a temporary compression-bonding machine with a tool width of 1.5 mm using Teflon (registered trademark) with a thickness of 150 μm as a buffer material under conditions of 70° C., 1 MPa, and 2 seconds.

After that, the anisotropic conductive film was drawn mechanically in a 90° direction and separated from the glass for evaluation. A state where the anisotropic conductive film was ruptured during the separation and the resin remained on a surface of the glass for evaluation was evaluated as NG, and a state where the anisotropic conductive film was not ruptured and was fully separated was evaluated as OK.

(e) Mounting Conductive Particle Capture Ratio

An IC chip having a size of 0.5×1.8×20.0 mm (bump size: 30×85 μm, bump height: 15 μm, bump pitch: 50 μm) was mounted on a glass wiring substrate (1737F) having a size of 0.5×50×30 mm available from Corning Incorporated using each anisotropic conductive film under conditions of 180° C., 80 MPa, and 5 seconds to obtain a connection structure sample.

"Mounting Conductive Particle Capture Ratio"

The ratio (%) of the "number of the conductive particles actually captured on the bump of the connection structure sample after heating and pressurization" to the "number of the conductive particles existing on the bump of the connection structure sample before heating and pressurization" was determined by the following expression. The ratio was taken as a mounting conductive particle capture ratio.

The number of the conductive particles existing on the bump of the connection structure sample before heating and pressurization was calculated from the number density of the conductive particles and the bump area of ACF before heating and pressurization. The number of the conductive particles existing on the bump of the connection structure sample after heating and pressurization was determined by observation by an optical microscope.

In practical terms, the ratio is preferably 50% or more.

Mounting Conductive Particle Capture Ratio (%)={[the number of conductive particles on bump after heating and pressurization]/[the number of conductive particles on bump before heating and pressurization]}×100

(f) Initial Conduction

The conduction resistance of the connection structure sample was measured.

modulus of the first insulating resin layer was high, and therefore the elastic modulus of the film as a whole was high.

In Example 7, the mounting conductive particle capture ratio was slightly lower than that of Example 2, but no problem in practical terms occurred. The same preferable results as in Example 2 in the elastic modulus of the film as a whole, temporary compression-bonding repairability, and the initial conduction were exhibited.

In contrast, in the anisotropic conductive film of Comparative Example 1, the elastic modulus of the film as a whole was low, and therefore the temporary compression-bonding repairability was inferior.

In the anisotropic conductive films of respective Examples and Comparative Example, the mounting conductive particle capture ratio and the initial conduction were good.

TABLE 1

| | | | | Example | | | | | | | Comparative Example |
|---|---|---|---|---|---|---|---|---|---|---|---|
| | | | | 1 | 2 | 3 | 4 | 5 | 6 | | 1 |
| First Insulating Resin Layer | Phenoxy Resin | YP-50 | Nippon Steel & Sumikin Chemical Co., Ltd. | 60 | 60 | 60 | 60 | 60 | 60 | | 60 |
| | Acrylate | EB600 | Daicel-Allnex Ltd. | 40 | 40 | 40 | 40 | 40 | 40 | | 40 |
| | Photo-Radical Polymerization Initiator | IRGACURE 369 | BASF Japan Ltd. | 2 | 2 | 2 | 2 | 2 | 2 | | 2 |
| | Thermal Cationic Polymerization Initiator | SI-60L | Sanshin Chemical Industry Co., Ltd. | 2 | 2 | 2 | 2 | 2 | 2 | | 2 |
| Conductive Particle | | AUL704 | Sekisui Chemical Co., Ltd. | Single-Layer Arrangement | | | | | | | |
| Intermediate Layer | Crystalline Resin Film | | | — | mp. 100° C. | mp. 130° C. | mp. 160° C. | mp. 160° C. | mp. 100° C. | | — |
| Second Insulating Resin Layer | Phenoxy Resin | YP-50 | Nippon Steel & Sumikin Chemical Co., Ltd. | 60 | 60 | 60 | 60 | 60 | 60 | | 60 |
| | Epoxy Resin | jER828 | Mitsubishi Chemical Corporation | 40 | 40 | 40 | 40 | 40 | 40 | | 40 |
| | Thermal Cationic Polymerization Initiator | SI-60L | Sanshin Chemical Industry Co., Ltd. | 2 | 2 | 2 | 2 | 2 | 2 | | 2 |
| Thickness of First Insulating Resin Layer (μm) | | | | 15 | 10 | 10 | 10 | 10 | 10 | | 15 |
| Thickness of Intermediate Layer (μm) | | | | — | 5 | 5 | 5 | 5 | 5 | | — |
| Thickness of Second Insulating Resin Layer (μm) | | | | 10 | 10 | 10 | 10 | 10 | 10 | | 10 |
| (a) Elastic Modulus of Anisotropic Conductive Film As a Whole (MPa) | | | | 0.15 | 0.15 | 0.18 | 0.25 | 0.13 | 0.19 | | 0.10 |
| (b) Elastic Modulus of First Insulating Resin Layer (MPa) | | | | 0.16 | 0.13 | 0.13 | 0.13 | 0.06 | 0.2 | | 0.11 |
| (c) Elastic Modulus of Layered Body of First Insulating Resin Layer and Intermediate Layer (MPa) | | | | — | 0.16 | 0.25 | 0.4 | 0.14 | 0.2 | | — |
| (d) Temporary Compression-Bonding Repairability | | | | OK | OK | OK | OK | OK | OK | | NG |
| (d) Mounting Conductive Particle Capture Ratio (%) | | | | More than 70 | More than 70 | More than 70 | More than 70 | More than 70 | More than 70 | | More than 70 |
| (f) Initial Conduction (Ω) | | | | 0.2 | 0.2 | 0.2 | 0.2 | 0.2 | 0.2 | | 0.2 |

As seen from Table 1, the thicknesses of the anisotropic conductive films of respective Examples and Comparative Example are all the same. In the anisotropic conductive films of Examples 1 to 6, the elastic moduluses of the anisotropic conductive films as a whole were within a range of 0.13 to 0.25 MPa, and all exhibited favorable temporary compression-bonding repairability. In particular, in the anisotropic conductive films of Examples 2 to 4, the elastic modulus of the first insulating resin layer was the same, but the elastic modulus of the intermediate layer was different. In the anisotropic conductive film of Example 5, the elastic modulus of the first insulating resin layer was comparatively low, but the elastic modulus of the intermediate layer was high. In the anisotropic conductive film of Example 6, the elastic

INDUSTRIAL APPLICABILITY

In the anisotropic conductive film of the present invention, the first insulating resin layer obtained by photo-radically polymerizing a photo-radically polymerizable resin layer and the second insulating resin layer formed of a thermo-cationically or thermo-anionically polymerizable resin, a photo-cationically or photo-anionically polymerizable resin, a thermo-radically polymerizable resin layer, or a photo-radically polymerizable resin are layered, and the conductive particles are disposed in a single layer on the surface of the first insulating resin layer on the side of the second insulating resin layer. Therefore, excellent initial conduction and conduction reliability, and low short circuit occurrence ratio due to favorable conductive particle capture ratio are exhibited. Further, the anisotropic conductive film is stiff by adjusting the elastic modulus of the anisotropic conductive film as a whole. Therefore, problems hardly occur in which the insulating resin layer is protruded, shift of a position occurs during temporary compression-bonding of anisotropic conductive connection, and the film is unlikely to be repaired after temporary compression-bonding. Accordingly, the anisotropic conductive film of the present invention is useful in anisotropic conductive connection of an electronic component such as an IC chip to a wiring substrate. The width of the wiring of the electronic component has been decreased. The present invention is particularly useful in anisotropic conductive connection of an electronic component having a decreased wiring width.

REFERENCE SIGNS LIST 1A, 1B anisotropic conductive film
2, first insulating resin layer
2a surface of first insulating resin layer
2b outer surface of first insulating resin layer
2X region where conductive particles are present on the side of second insulating resin layer in first insulating resin layer
2Y region where conductive particles are not present on the side of second insulating resin layer in first insulating resin layer
3 second insulating resin layer
4 intermediate layer
10 conductive particle
20 photopolymerizable resin layer
30 release film
31 release film

The invention claimed is:

1. An anisotropic conductive film comprising a first insulating resin layer and a second insulating resin layer that are layered, wherein
the first insulating resin layer is formed of a photopolymerized resin and optionally one or more film-forming resins, the photopolymerized resin having a curing ratio of 75% or more,
the second insulating resin layer is formed of a thermo-cationically or thermo-anionically polymerizable resin, a photo-cationically or photo-anionically polymerizable resin, a thermo-radically polymerizable resin, or a photo-radically polymerizable resin,
conductive particles for anisotropic conductive connection are disposed in a single layer on a surface of the first insulating resin layer on a side of the second insulating resin layer,
the not fully cured anisotropic conductive film as a whole has an elastic modulus of 0.13 MPa or more,
the elastic modulus of a layer or film is determined by applying a constant displacement (measurement pressure: 0 to 5 g) at 30° C. in a twisting direction by a rotational rheometer and measuring a change of stress over time, and determining a stress (elastic modulus) of the layer or film at an elapse time of 0.1 minute, and
the first insulating resin layer has a curing ratio of from 40 to 80% in a region 2X and a curing ratio of from 70 to 100% in a region 2Y, wherein region 2X is a region between the conductive particles and an outer surface of the first insulating resin layer, and region 2Y is a region where the conductive particles are not present on the side of the second insulating resin layer.

2. The anisotropic conductive film according to claim 1, wherein the first insulating resin layer has an elastic modulus of 0.06 MPa or more.

3. The anisotropic conductive film according to claim 1, comprising an intermediate layer that is formed of a crystalline resin and provided between the first insulating resin layer and the second insulating resin layer.

4. The anisotropic conductive film according to claim 3, wherein a layered film of the first insulating resin layer and the intermediate layer has an elastic modulus of 0.14 MPa or more.

5. The anisotropic conductive film according to claim 3, wherein the anisotropic conductive film as a whole has a curing ratio of 75% or more.

6. The anisotropic conductive film according to claim 1, wherein the anisotropic conductive film as a whole has a curing ratio of 75% or more.

7. A production method of the anisotropic conductive film according to claim 1, the production method comprising the following steps (A) to (C):
Step (A)
a step of disposing conductive particles in a single layer on a photopolymerizable resin layer;
Step (B)
a step of irradiating the photopolymerizable resin layer having the disposed conductive particles with ultraviolet light to cause a photopolymerization reaction, to thereby form the first insulating resin layer in which the conductive particles are fixed in a surface thereof; and
Step (C)
a step of forming the second insulating resin layer that is formed of a thermo-cationically or thermo-anionically polymerizable resin, a photo-cationically or photo-anionically polymerizable resin, a thermo-radically polymerizable resin, or a photo-radically polymerizable resin, wherein
the first insulating resin layer is formed by performing the photopolymerization reaction in the step (B) so that the elastic modulus of the anisotropic conductive film as a whole is 0.13 MPa or more, and
the second insulating resin layer formed in the step (C) is layered on the first insulating resin layer formed in the step (B) on a side of the conductive particles.

8. The production method of the anisotropic conductive film according to claim 7, wherein in the step (B) the photopolymerizable resin layer is irradiated with ultraviolet light from the side of the conductive particles.

9. A production method of the anisotropic conductive film according to claim 1, the production method comprising the following steps (A) to (D):
Step (A)
a step of disposing conductive particles in a single layer on a photopolymerizable resin layer;
Step (B)
a step of irradiating the photopolymerizable resin layer having the disposed conductive particles with ultraviolet light to cause a photopolymerization reaction, to thereby form the first insulating resin layer in which the conductive particles are fixed in a surface thereof;
Step (C)
a step of forming the second insulating resin layer that is formed of a thermo-cationically or thermo-anionically polymerizable resin, a photo-cationically or photo-anionically polymerizable resin, a thermo-radically polymerizable resin, or a photo-radically polymerizable resin; and Step (D)
a step of forming a layered body in which an intermediate layer formed of a crystalline resin and the second insulating resin layer are layered in sequence on the first insulating resin layer formed in the step (B) on a side of the conductive particles.

10. The production method according to claim 9, wherein, after the second insulating resin layer is formed in the step (C), the intermediate layer formed of the crystalline resin is layered on the second insulating resin layer to form the layered body, and the layered body and the first insulating resin layer formed in the step (B) are layered to perform the step (D).

11. The production method according to claim 9, wherein the intermediate layer formed of the crystalline resin and the second insulating resin layer formed in the step (C) are layered in sequence on the first insulating resin layer formed in the step (B) on the side of the conductive particles to perform the step (D).

12. The production method of the anisotropic conductive film according to claim 9, wherein in the step (B) the photopolymerizable resin layer is irradiated with ultraviolet light from the side of the conductive particles.

13. A connection structure in which a first electronic component and a second electronic component are connected by anisotropic conductive connection through the anisotropic conductive film according to claim 1.

14. The production method of the anisotropic conductive film according to claim 10, wherein in the step (B) the photopolymerizable resin layer is irradiated with ultraviolet light from the side of the conductive particles.

15. The production method of the anisotropic conductive film according to claim 11, wherein in the step (B) the photopolymerizable resin layer is irradiated with ultraviolet light from the side of the conductive particles.

16. A method of manufacturing a connection structure, comprising connecting a first electronic component with a second electronic component by anisotropic conductive connection via an anisotropic conductive film according to claim 1.

* * * * *